United States Patent
Mazeau et al.

(10) Patent No.: US 11,489,253 B2
(45) Date of Patent: Nov. 1, 2022

(54) RADIANT-PANEL RADIO STIMULATION DEVICE

(71) Applicant: THALES, Courbevoie (FR)

(72) Inventors: Thierry Mazeau, Merignac (FR); Daniel Jahan, Brest (FR); Stéphane Formont, Elancourt (FR); Loïc Menager, Elancourt (FR)

(73) Assignee: THALES, Courbevoie (FR)

( * ) Notice: Subject to any disclaimer, the term of this patent is extended or adjusted under 35 U.S.C. 154(b) by 265 days.

(21) Appl. No.: 16/760,651

(22) PCT Filed: Sep. 7, 2018

(86) PCT No.: PCT/EP2018/074106
§ 371 (c)(1),
(2) Date: Apr. 30, 2020

(87) PCT Pub. No.: WO2019/091624
PCT Pub. Date: May 16, 2019

(65) Prior Publication Data
US 2020/0350674 A1    Nov. 5, 2020

(30) Foreign Application Priority Data

Nov. 7, 2017    (FR) .................................... 1701140

(51) Int. Cl.
| | | |
|---|---|---|
| *H01Q 3/26* | (2006.01) | |
| *G01R 29/10* | (2006.01) | |
| *G01S 17/08* | (2006.01) | |
| *H04Q 11/00* | (2006.01) | |
| *G01S 7/02* | (2006.01) | |
| *G01S 7/40* | (2006.01) | |

(52) U.S. Cl.
CPC .......... *H01Q 3/2676* (2013.01); *G01R 29/10* (2013.01); *G01S 7/021* (2013.01); *G01S 17/08* (2013.01);
(Continued)

(58) Field of Classification Search
CPC ...... H01Q 3/267; H01Q 3/2676; H04Q 11/00; G01S 17/08
See application file for complete search history.

(56) References Cited

U.S. PATENT DOCUMENTS

2009/0092158 A1 *   4/2009   Izadpanah ............... G01S 13/24
                                                        372/18

FOREIGN PATENT DOCUMENTS

| CN | 100559135 C | * | 11/2009 |
|---|---|---|---|
| FR | 2 695 759 A1 | | 3/1994 |

(Continued)

OTHER PUBLICATIONS

Godinez, et al., "RF Characterization of Zero-Biased Photodiodes", Journal of Lightwave Technology, vol. 26, Issue 24, pp. 3829-3834, (2008).

(Continued)

*Primary Examiner* — Dameon E Levi
*Assistant Examiner* — Leah Rosenberg
(74) *Attorney, Agent, or Firm* — BakerHostetler

(57) ABSTRACT

A stimulation device notably for testing radio reception devices is provided. It includes a signal generator delivering an amplitude-phase law for beam-forming purposes, transmitted in the form of a composite laser beam which illuminates a matrix of photodiodes of an emission subassembly with active modules separate from the generator, each wavelength of the beam carrying one of the signals defining the amplitude-phase law, intended for an active module. The device comprises means for measuring the orientation of the composite laser beam relative to the matrix of photodiodes of the emission subassembly and the distance traveled by the beam thereto, and correcting the phase law generated by the
(Continued)

signal generator so as to neutralize the stray phase-shifts induced by these parameters on the signals transmitted to the emission subassembly.

10 Claims, 6 Drawing Sheets

(52) U.S. Cl.
CPC ............. *H01Q 3/267* (2013.01); *H04Q 11/00* (2013.01); *G01S 7/4082* (2021.05)

(56) References Cited

FOREIGN PATENT DOCUMENTS

| FR | 1700081 | | 1/2017 | | |
|---|---|---|---|---|---|
| FR | 3062242 | A1 | 7/2018 | | |
| GB | 2267603 | A * | 12/1993 | ............. | H01Q 3/267 |
| WO | 2015/028091 | A1 | 3/2015 | | |
| WO | WO-2015028091 | A1 * | 3/2015 | ........... | H01Q 3/2676 |

OTHER PUBLICATIONS

Dorsey, et al., "Design and Performance of Frequency Selective Surface With Integrated Photodiodes for Photonic Calibration of Phased Array Antennas", IEEE Transactions on Antennas and Propagation, vol. 58, No. 8, pp. 2588-2593, 2010.

Paek, et al., "Photonic in-situ calibration of a phased array antenna using planar lightwave circuit", 2005 International Topical Meeting on Microwave Photonics, pp. 351-354, 2005.

Levine, et al., "Fiber optic networks for phased arrays", 17th Convention of Tel Aviv, pp. 390-393, 1991.

\* cited by examiner

RADIANT-PANEL RADIO STIMULATION DEVICE

CROSS-REFERENCE TO RELATED APPLICATIONS

This application is a National Stage of International patent application PCT/EP2018/074106, filed on Sep. 7, 2018, which claims priority to foreign French patent application No. FR 1701140, filed on Nov. 7, 2017, the disclosures of which are incorporated by reference in their entirety.

FIELD OF THE INVENTION

The invention relates to the general technical field of beam-forming antennas, in particular those produced in solid state form.

The invention relates more particularly to the testing and stimulation of radio reception systems such as, for example, the radar detectors or communication interceptors, in particular when the latter are installed on their carrier platform.

BACKGROUND

To stimulate a radio reception system, once installed on its carrier platform, without making any alteration thereto, one possibility is to use a stimulation device such as that described in the French patent application FR1700081 filed on Jan. 26, 2017.

Such a device which makes it possible to illuminate an aerial with a radio wave carrying a given phase law, comprises a plurality of distributed individual antennas. It also comprises an emitter module remote from the aerial under test and a receiver module placed in the vicinity of the radiating surface thereof. The emitter module generates a signal resulting from the combination of a plurality of carrier signals at different carrier frequencies, each being modulated by a specific modulation signal. It also transmits this signal to the receiver module which comprises a plurality of individual receivers each associated with a radiating element. Each individual receiver performs the demodulation of one of the modulated carrier signals received by the receiver module, and radiates the demodulated signal to the surface of the aerial under test. Moreover, each individual receiver is arranged on the receiver module such that its radiating element is located facing one of the antennas forming the radio reception system under test and the radio signal that it emits is picked up mostly by this antenna.

This solution does however involve the use of hardware devices, the individual receivers in particular, which have to be pressed onto the aerials of said radio reception system under test.

Consequently, without in any way being considered intrusive, such a solution has practical impacts. In particular, it limits the accessibility to the aerials of the system being tested. Moreover, it also has limitations induced by the efficiencies of coupling of the antennas of a receiver module of the test device with those of the aerial of the system under test with which it is associated.

To stimulate a radio reception system, once installed on its carrier platform, without making any alteration thereto, it is also possible, as is known, to make use of a conventional generation of a radio signal and of the remote emission of this signal to the radio reception system to be tested. The distance does however demand having a certain level of radiated power toward said radio reception system.

This constraint leads to the consideration of the solutions having structures similar to those of the operational emitters, radio reception systems for which the test is required being, in principle, suitable for receiving the signals from such emitters.

The corresponding devices have architectures similar to radar architectures, limited however to the emission function and, in particular, architectures similar to those of the electron scanning radars which offer the benefit of not involving mechanical means to ensure the aiming of the antenna beam in the desired direction.

These architectures are generally compact, the emitter produced in this way being a single-piece element. Now, for the applications targeted, namely non-intrusive test applications, there is a need to separate the subassembly generating the test signal from the subassembly radiating the latter, while simplifying to the maximum the structure of the radiating subassembly because the latter can be multiplied.

Consequently, the technical problem which arises, in the presence of a generation subassembly and of a radiating subassembly that are separate, even remote, from one another, consists in finding a solution that makes it possible to transmit to the second subassembly the stimulation signal generated by the first subassembly, without affecting the phase law carried by this signal.

The test devices of the state of the art do not generally make it possible to address this problem, inasmuch as they are generally compact devices whose structure corresponds to the schematic diagrams of FIGS. 1 and 2.

FIG. 1 presents a device structure in which the phase law is produced by controlled phase-shifters 11 (conventional structure) placed at the output of a waveform generator (GFO) 12, amplitude- and frequency-controlled, each phase-shifter delivering a signal carrying a given phase to an emission module 13.

FIG. 2 presents a device structure in which the phase law is produced by direct synthesis by waveform generators 21 controlled also by an amplitude, frequency and phase control 22 (MIMO or Multiple Input Multiple Output structure).

One solution to the problem posed consists in producing a physical separation between the emission modules and the signal generation modules at the output of the phase-shifted signals, just before the power amplification, as illustrated by the dotted lines 15 of FIGS. 1 and 2.

This break means physically grouping together that which produces all of the phase-shifted signals, whether it be a solution with phase-shifters illustrated by FIG. 1 or a solution based on waveform generators (GFO) illustrated by FIG. 2, and in physically grouping together the power amplification and radiation functions in a so-called emission subassembly and the excitation signal synthesis functions in a so-called signal generation subassembly.

The technical problem initially posed then therefore consists, in such a case, in finding a means that makes it possible to perform the routing of the radio signals, carrying the phase law, produced by generation means, signals that can reach several tens of GHz, to the amplification and radiation means which can be remote from the former by several meters, even by several tens of meters.

As is known, the transmission of the electrical signals of the signal generation subassembly 31 to the subassembly 32 emitting the signals can be performed by means of an offset by optical fiber 33 as in the case of the device illustrated by FIG. 3. Each electrical signal 311 from the waveform generator is then carried by a light wave 312 of dedicated wavelength.

Moreover, each light wave 312 can be transmitted separately to the corresponding module 321 of the emitter subassembly by a dedicated optical fiber 33, as illustrated more particularly by FIG. 3. Alternatively, the different light waves can be multiplexed and transmitted grouped together over one or more optical fibers.

This transmission mode, which makes it possible to ensure a transmission without significant alteration of the electrical signals from the signal generation subassembly to the emission subassembly, nevertheless has the drawback of maintaining a physical link, although loose, between the two subassemblies, which can constitute a difficulty for certain applications.

Alternatively, as is also known, the transmission of the electrical signals from the signal generation subassembly to the subassembly emitting these signals can be performed, without hardware support, by means of a radio beam or of a laser beam as explained in the French patent application FR1700081 cited previously. FIG. 4 schematically presents an example of test device structure, formed by two subassemblies separate from one another in which the transmission of the electrical signals is performed by means of an aimed composite laser beam.

This transmission mode offers the advantage of eliminating any physical link between the two subassemblies. On the other hand, it has the drawback of leading to an alteration of the phase law formed by the signals received by the emission subassembly, this alteration being primarily due to the direction of arrival of the received composite laser beam relative to the emission subassembly and to the distance between the signal generation subassembly and the emission subassembly.

Consequently, because of the alteration of the phase law, the radio beam emitted by the emission subassembly exhibits, relative to its reference direction which corresponds to an equi-phase distribution, a deflection that is different from the deflection corresponding to the desired phase law, carried by the electrical signals generated by the waveform generator.

This alteration can in certain cases be sufficient to significantly degrade operation of the test device, such that a means has to be found to cancel or at least significantly reduce the effects thereof.

SUMMARY OF THE INVENTION

Given the context described previously, one aim of the invention is to propose a solution that makes it possible to neutralize the effects of the orientation of the composite laser beam relative to the emission subassembly, and the distance separating the two subassemblies, on the on the orientation of the radio beam emitted by the emission subassembly, in other words on the phase law applied to the radiating elements forming the emission subassembly.

To this end, the subject of the invention is a radiant panel radio stimulation device, for emitting a test signal to a reception antenna.

Said device comprises a subassembly generating excitation electrical signals each having a phase corresponding to a desired phase law $\{\Delta\varphi_n\}$ and at least one emission subassembly configured to amplify and radiate said electrical signals so as to emit a radio beam in a direction determined by said phase law $\{\Delta\varphi_n\}$.

The electrical signals are transmitted by the generator subassembly to the emission subassembly in the form of laser waves modulated by said signals and forming a composite laser beam directed toward the surface of a set of photodetectors incorporated in the emission subassembly.

According to the invention, the electrical signal generator subassembly and the emission subassembly are arranged facing one another such that the composite laser beam is directed toward the surface of the set of photodetectors at an incidence $(\alpha,\beta)$ relative to a reference axis and that it travels a distance D between its point of emission M and a reference point O situated on the reference axis at the surface of the set of photodetectors.

The device further comprises a correction system configured to measure the values $\alpha$, $\beta$ and D and deliver a corrected phase law $\{\Delta\varphi'_n\}$ that is substituted for the desired phase law $\{\Delta\varphi_n\}$, the corrected phase law being defined such that the radio beam produced from the signals generated by the signal generator module is oriented in the direction corresponding to the desired phase law $\{\Delta\varphi_n\}$.

According to a particular provision, the corrected phase law $\Delta\varphi'_n$ is determined from the calculation of the path-length difference $\delta_n = D'_n - D$ generated, at each of the photodetectors, by the angle of incidence of the composite laser beam on the surface of the set of photodetectors of the emission subassembly, $\Delta\varphi'_n$ being defined by the relationship:

$$\Delta\varphi'_n = \Delta\varphi_n - 2\pi \frac{f_s}{c} \cdot \delta_n;$$

in which $D'_n$ representing the distance between the point of emission M of the composite laser beam and the position $P_n$ of the photodetector considered.

According to another particular provision, the photodetectors which form the set of photodetectors of the emission subassembly are arranged in a plane (xOz) on which their positions $P_n$ are registered, in terms of polar coordinates, by a distance $d_n'$ and an angle $\gamma_n'$.

The path-length difference $\delta_n$ is then defined, for each photodetector, by the following relationship:

$$\delta_n = D'_n - D = D \cdot \left( \sqrt{1 - 2(\cos\gamma'_n\cos\beta\cos\alpha + \sin\gamma'_n\sin\beta)\left(\frac{d'_n}{D}\right) + \left(\frac{d'_n}{D}\right)^2} - 1 \right)$$

According to another provision, the values $\alpha$, $\beta$ and D are determined by considering a plurality of non-aligned points $C_n$, situated on the surface of the set of photodetectors, and by determining the distance $D_n$ separating the point M of emission of the composite laser beam from each of the points $C_n$ considered.

According to another provision, the values $\alpha$, $\beta$ and D are determined by considering at least three non-aligned points.

According to another provision, the points $C_n$ being registered in the plane (xOz) by their distance $d_n$ to the reference point O and by the angle $\gamma_n$ between the axis linking the point $C_n$ considered to the point O and the reference axis (Ox), D, $\alpha$ and $\beta$ are given by the following relationships:

$$D = \sqrt{\frac{d_2 d_3 (D_1^2 - d_1^2)[\cos\gamma_2 \sin(\gamma_1 - \gamma_3) - \cos\gamma_3 \sin(\gamma_1 - \gamma_2)]}{d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)}} + \frac{d_1 \cos\gamma_1 [d_2(D_3^2 - d_3^2)\sin(\gamma_1 - \gamma_2) - d_3(D_2^2 - d_2^2)\sin(\gamma_1 - \gamma_3)]}{d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)};$$

$$\beta = \text{Arcsin}\frac{(d_1^2 + D^2 - D_1^2)d_2\cos\gamma_2 - (d_2^2 + D^2 - D_2^2)d_1\cos\gamma_1}{2d_1 d_2 D \sin(\gamma_1 - \gamma_2)} \text{ and}$$

$$\alpha = \text{Arccos}\frac{\frac{d_1^2 + D^2 - D_1^2}{2d_1 D} - \sin\gamma_1 \sin\beta}{\cos\gamma_1 \cos\beta}.$$

According to another provision, the distances $D_n$ are measured by laser rangefinding.

According to another provision, the distances $D_n$ are measured by using the composite laser beam produced by the signal generator subassembly.

According to another provision, the set of photodetectors consists of a matrix of photodiodes each associated with an optical filter configured to allow the exposure of the photodiode considered only to one of the modulated laser waves forming the composite laser beam.

The technical features presented by the device according to the invention in accordance with the various provisions listed above can, in the context of the invention, be considered separately from one another or else in various combinations.

According to a particular embodiment, the device according to the invention comprises an electrical signal generator subassembly and at least two emission subassemblies, the aimed optic being configured to direct the composite laser beam alternately to one or other of the emission subassemblies, the phase law correction system being configured to deliver, at each moment, the corrected phase law $\{\Delta\varphi_n'\}$ corresponding to the subassembly to which the composite laser beam is directed at the instant considered.

BRIEF DESCRIPTION OF THE DRAWINGS

The features and advantages of the invention will be better appreciated from the following description, a description which is based on the attached figures which present.

It should be noted that, for the attached figures, a functional or structural element that is the same preferably bears one and the same reference symbol.

DETAILED DESCRIPTION

Figure 4:
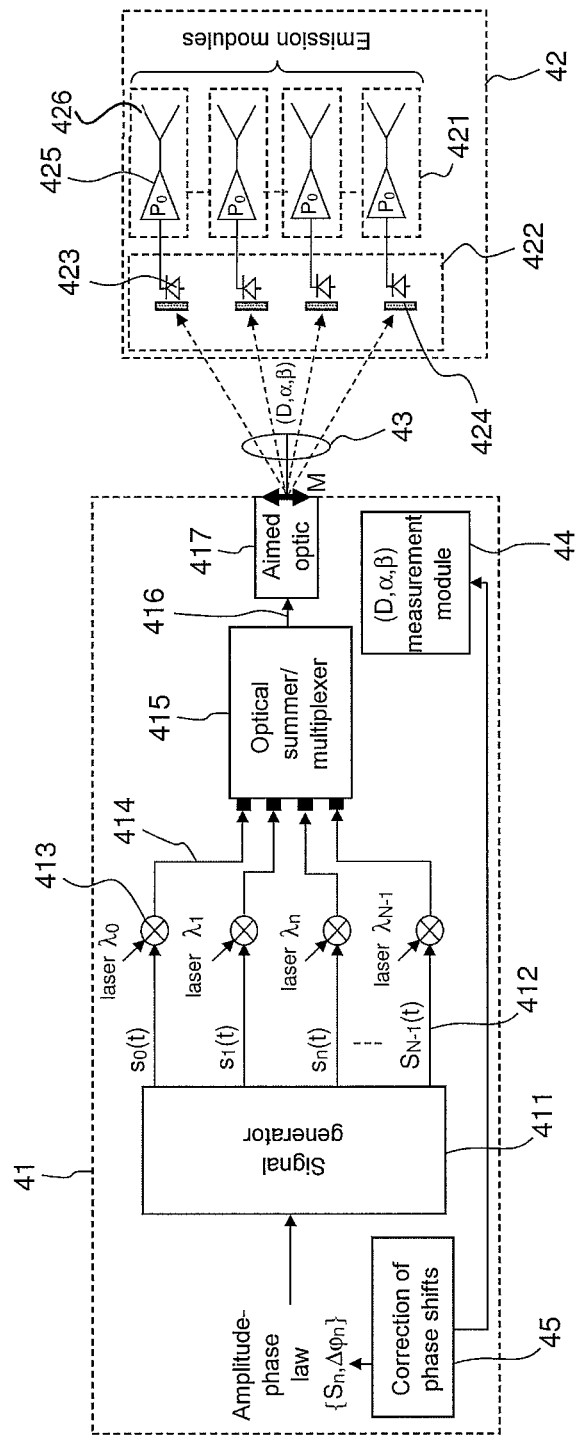
FIG. 4, a schematic illustration of the structure of an exemplary embodiment of the radiant panel radio stimulation device according to the invention.

FIG. 4 schematically presents, by way of nonlimiting example, the structure of a radiant panel radio stimulation device implementing the invention.

Such a device comprises two physically separate subassemblies:

a first subassembly 41 comprising an electrical signal generator 411 producing electrical signals 412 phase-shifted relative to one another in accordance with a given phase law, the phase law applied corresponding to the direction in which it is wanted to orient the emission of the test radio signal;

a second emission subassembly 42 comprising beam-forming radiant panels, consisting of a certain number of emission modules 421 configured to each radiate one of the electrical signals generated.

The subassembly 41 further comprises means 413, 414 and 415 that make it possible to perform the transmission of the electrical signals 412, on an optical carrier 43 modulated by said signals, to the subassembly 42.

The subassembly 42 comprises, for its part, a set of means 422 for handling the reception of the composite laser beam 43 and the demodulation thereof, so as to restore the electrical signals carried by the light wave.

Figure 1:
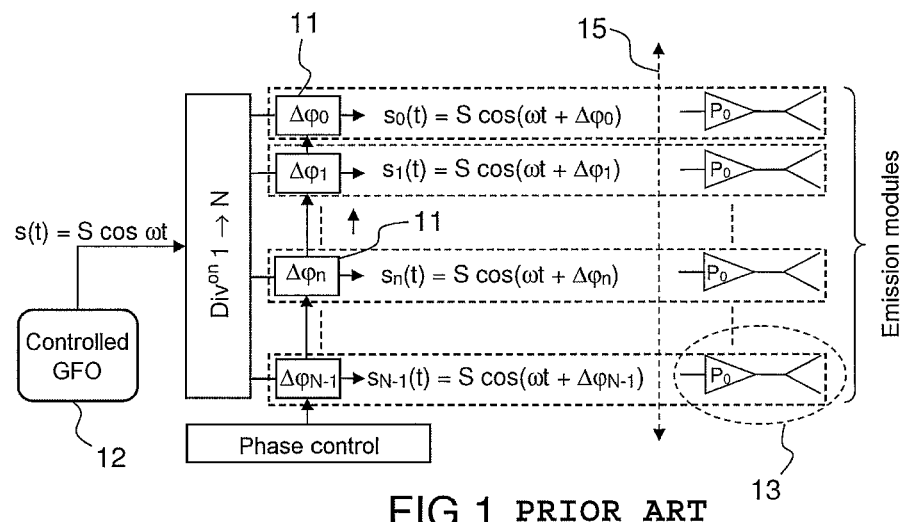
FIG. 1, a schematic illustration of the structure of a first type of radiant panel radio stimulation device known from the prior art.
Figure 2:
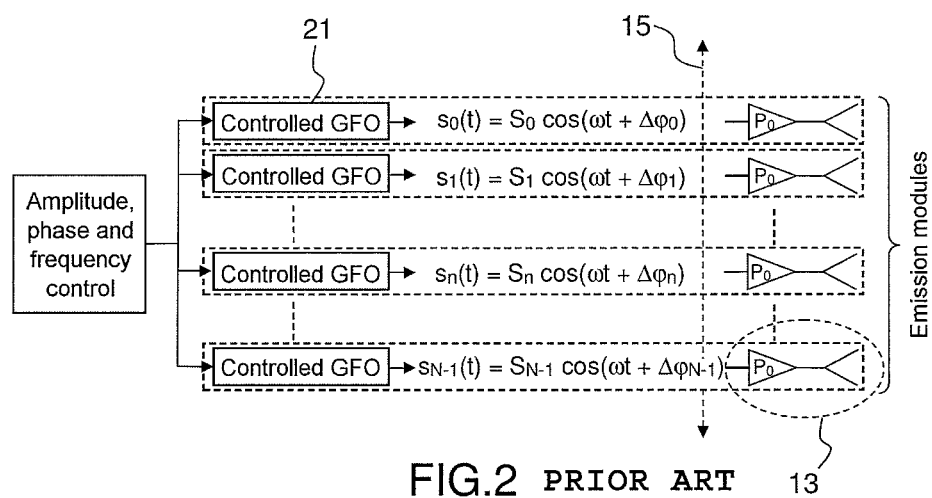
FIG. 2, a schematic illustration of the structure of a second type of radiant panel radio stimulation device known from the prior art.
Figure 3:
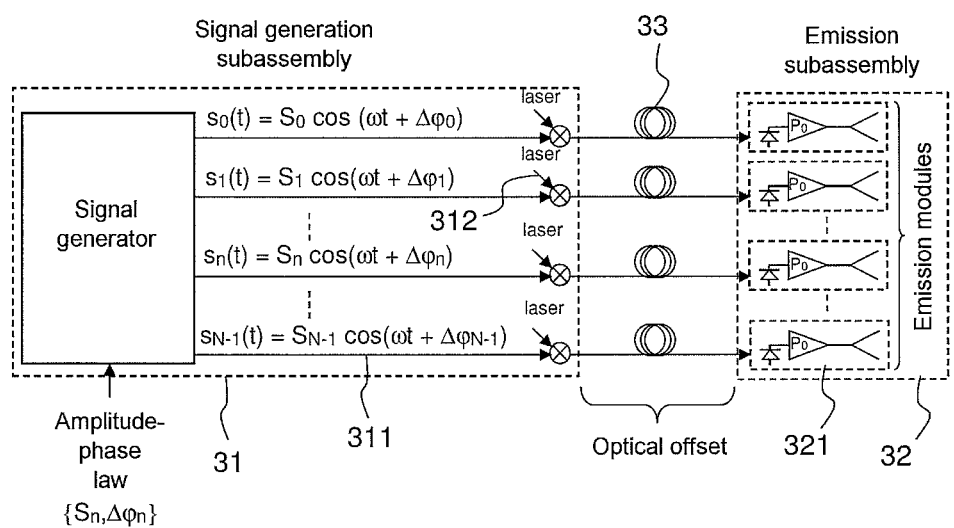
FIG. 3, a schematic illustration of the structure of a third type of radiant panel radio stimulation device known from the prior art.

The first subassembly 41 thus primarily comprises, conventionally:

a electrical signal generator 411 producing N electrical signals 412: $s_0(t)=S_0 \cos(\omega t+\Delta\varphi_0)$, $s_1(t)=S_1 \cos(\omega t+\Delta\varphi_1)$, ..., $s_{N-1}(t)=S_{N-1} \cos(\omega t+\Delta\varphi_{N-1})$, the structure of said signal generator being able to be analogous, for example, to one or other of those illustrated by FIG. 1 or 2;

N laser sources of distinct wavelengths $\lambda_0, \lambda_1, \ldots, \lambda_{N-1}$;

N optical modulators 413, each optical modulator allowing the amplitude modulation of a laser source of wavelength $\lambda_n$ by an input electrical signal $S_n \cos(\omega t+\Delta\varphi_n)$; a multiplexer 415 making it possible to sum the N modulated laser signals 414 produced, carrying the amplitude-phase law, and form a composite laser signal 416;

an aimed optic 417, for correctly radiating the composite laser signal 416, that is to say forming a composite laser beam 43, directing it and focusing it correctly to completely illuminate the light wave reception means 422 of the emission subassembly 42. In the example of FIG. 4, the means 422 consist of a planar matrix of photodiodes 423;

electrical energy supply and utility circuits, not represented in FIG. 4.

According to the invention, the first subassembly 41 further comprises a system for correcting the phase law applied to the signal generator 411, the system itself comprising:

a measurement module 44 making it possible to determine the quantities D, α and β. D represents the distance between the aimed optic 417 and the matrix of photodiodes 422, and (α,β) represents the angular orientation of the axis of the composite laser beam 43 to a reference direction defined by the matrix of photodiodes 422;

a correction module 45 whose role is to calculate a corrected amplitude-phase control law, intended to be applied to the signal generator 411, a law which is a function of the measurements of the quantities D, α and β performed by the measurement module 44.

The principle of operation of this correction device is presented hereinbelow in the text.

The emission subassembly 42, for its part, comprises:

a matrix 422 of N photodiodes 423, each photodiode being equipped with an optical filter 424 centered on a wavelength $\lambda_n$, allowing this wavelength to pass and not allowing the other wavelengths $\lambda_{n'\neq n}$ forming the composite laser beam 43 to pass;

N power amplifiers 425, each power amplifier receiving the electrical signal coming from a photodiode 423;

N antennas 426 disposed in a network to form a beam at the frequency $$f = \frac{\omega}{2\pi}$$

from the electrical signals generated by the electrical signal generator 411, each antenna 426 being powered by the output of a power amplifier 425;

electrical energy supply and utility circuits, not represented in FIG. 4.

Figure 5:
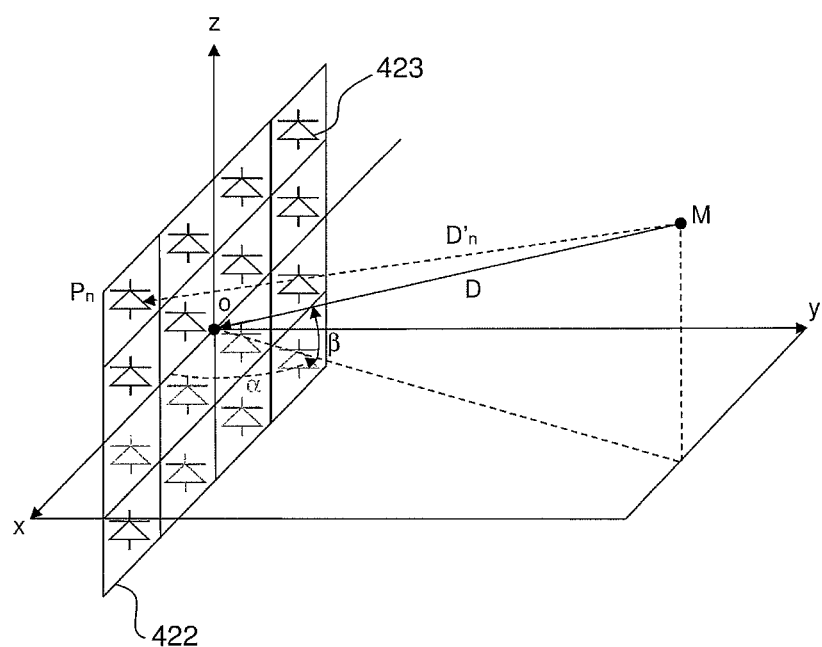
FIGS. 5 to 7, illustrations that highlight the technical problem posed in the context of the invention and the nature of the solution provided by the invention.
Figure 6:
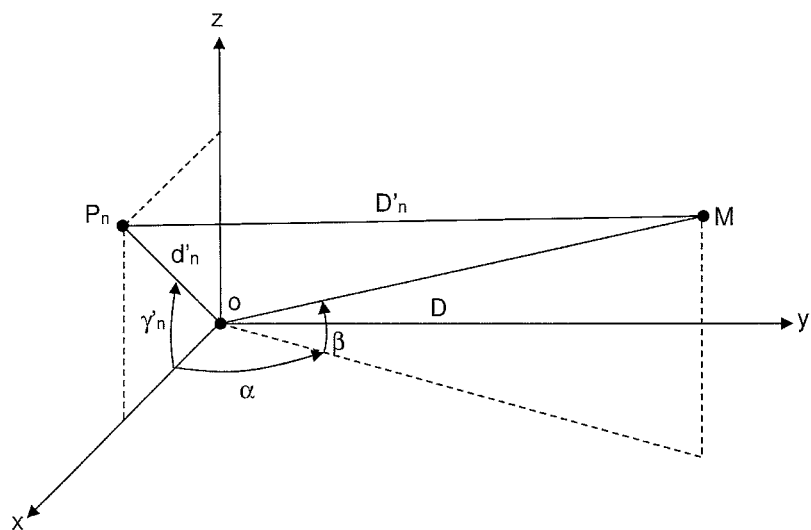
Figure 7:
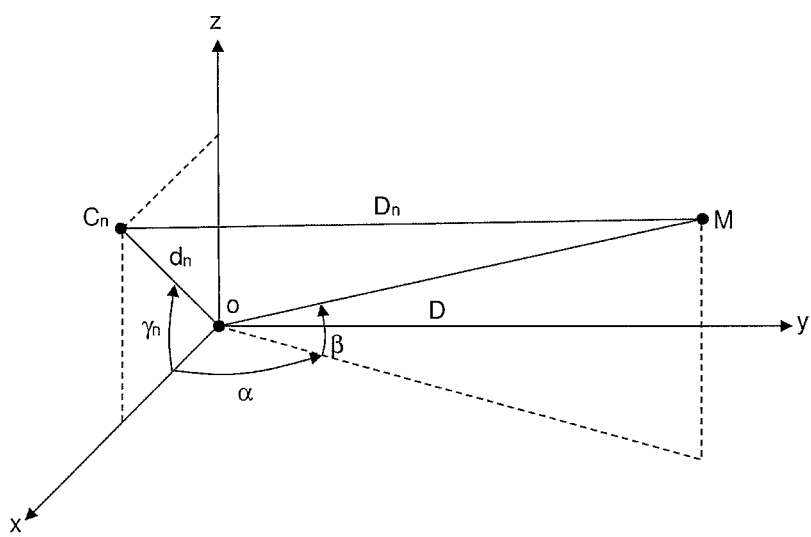

FIGS. 5 to 7 illustrate the principle of operation of the correction device with which the radiant panel radio stimulation device according to the invention is equipped.

In the context of FIGS. 5 to 7, for the purposes of simplifying the illustration, the matrix of photodiodes 423 is represented in the form of a planar structure on which the photodiodes are distributed regularly in rows and columns.

This disposition, which makes it easier to understand the invention, is used hereinbelow in the text to describe the principle of operation thereof. It should not however be considered as a limiting feature, any other arrangement of photodiodes making it possible to pick up all the components of the composite laser beam 43 being able to be implemented in the context of the invention.

It should however be noted that, from a hardware point of view, the matrix of photodiodes 422 in principle has a certain size, due to the fact that it is necessary to space apart the photodiodes 423 for them to be able to be illuminated adequately by the composite laser beam 43.

As FIG. 5 shows, the path $D_n'$ of the composite laser beam from the point M on leaving the aimed optic 417 to a given photodiode situated at the point $P_n$ of the plane (xOz) of the matrix 422 depends on a reference distance D from the point M to a point O of the matrix of photodiodes taken as reference, the center of the matrix for example, and on the spatial angular orientation (α,β) of the reference direction OM relative to a reference direction of the matrix of photodiodes 422, the axis (Ox) for example.

Given the relative positioning of the subassemblies 41 and 42 forming the device according to the invention, the paths $D_n'$ culminating at the set of photodiodes have lengths which are not strictly identical.

These length differences are due, firstly, to the spatial angular orientation (α,β) of the composite laser beam 43, and, secondly, to the distance D which may not be sufficiently great relative to the size of the matrix of photodiodes for its contribution to the path length differences $D_n'$ to be able to be disregarded.

These path length differences $D_n'$ are reflected by path-length differences $\delta_n = D_n' - D$ of different values for each photodiode 423. The result in a delay of the modulated laser signals which varies from one photodiode to the other depending on the position of the photodiode considered in the matrix 422.

Consequently, they induce phase-shifts $\Delta\varphi_{n[deg]} 1,2 f_{[GHz]} \cdot \delta_{n[mm]}$ on the electrical signals detected by the matrix of photodiodes 422 which are added ultimately for each signal to the phase corresponding to the phase law created at the origin and emitted by the aimed optic 417.

It should be noted that a simple numeric application makes it possible to confirm that these stray phase-shifts are not negligible.

Thus, for example, for an electrical signal, of 10 GHz frequency, carried by the laser beam 43, a path length difference of 10 mm creates a phase-shift of 120°.

Consequently, to obtain the desired phase law $\{\Delta\varphi_n\}$, the function of the correction module 45 according to the invention is to generate the phase law $\{\Delta\varphi_n\}$ induced by the path-length differences $\delta_n = D_n' - D$, from the measurements of D, α and β supplied by the measurement module 44 and to determine the phase law $\{\Delta\varphi_n'\}$, equal to $\{\Delta\varphi_n - \Delta\varphi_n\}$, to be generated at the generator 411.

Generally, the corrected phase law $\{\Delta\varphi_n'\}$, is given by the relationship:

$$\Delta\varphi_n' = \Delta\varphi_n - 2\pi\frac{f_s}{c}\cdot\delta_n \qquad [001]$$

In the particular case illustrated by FIGS. 5 to 7, the photodiodes responsible for detecting the composite laser beam are located placed in the plane (xOz) on which their positions $P_n$ are registered in terms of polar coordinates by the distance $d_n'$ between the point $P_n$ and the reference point O and by the angle $\gamma_n'$ that the segment $OP_n$ forms with the reference axis (Ox), as FIG. 6 illustrates.

The path-length difference $\delta_n$ is therefore given, in this case, by the following relationship:

$$\delta_n = D_n' - D \qquad [002]$$

$$= D \cdot \left(\sqrt{1 - 2(\cos\gamma_n'\cos\beta\cos\alpha + \sin\gamma_n'\sin\beta)\left(\frac{d_n'}{D}\right) + \left(\frac{d_n'}{D}\right)^2} - 1\right)$$

Consequently, for a desired phase law $\{\Delta\varphi_n\}$, the corrected phase law $\{\Delta\varphi_n'\}$ to be emitted is given by the following relationship:

$$\Delta\varphi_n' = \qquad [003]$$

$$\Delta\varphi_n - 2\pi f_s\frac{D}{c}\left(\sqrt{1 - 2(\cos\gamma_n'\cos\beta\cos\alpha + \sin\gamma_n'\sin\beta)\left(\frac{d_n'}{D}\right) + \left(\frac{d_n'}{D}\right)^2} - 1\right)$$

in which D, α and β represent the unknowns.

In order to have measurements of D, α and β, the measurement module 44 therefore performs, for at least three non-colinear points $C_1$, $C_2$ and $C_3$ of the plane (xOz) of the matrix of photodiodes 422, the measurements of the distances $D_1$, $D_2$ and $D_3$, separating these points from the point M of emission of the composite laser beam 43.

Consequently, if these points $C_n$ are registered in the plane (xOz) by the distance $d_n$ and the angle $\gamma_n$, as FIG. 7 illustrates, it is demonstrated that D, $\alpha$ and $\beta$ are given by the following relationships:

$$D = \sqrt{\frac{d_2 d_3 (D_1^2 - d_1^2)[\cos\gamma_2 \sin(\gamma_1 - \gamma_3) - \cos\gamma_3 \sin(\gamma_1 - \gamma_2)]}{d_3(d_2 \cos\gamma_2 - d_1 \cos\gamma_1)\sin(\gamma_1 - \gamma_3) - d_2(d_3 \cos\gamma_3 - d_1 \cos\gamma_1)\sin(\gamma_1 - \gamma_2)}} + \frac{d_1 \cos\gamma_1 [d_2(D_3^2 - d_3^2)\sin(\gamma_1 - \gamma_2) - d_3(D_2^2 - d_2^2)\sin(\gamma_1 - \gamma_3)]}{d_3(d_2 \cos\gamma_2 - d_1 \cos\gamma_1)\sin(\gamma_1 - \gamma_3) - d_2(d_3 \cos\gamma_3 - d_1 \cos\gamma_1)\sin(\gamma_1 - \gamma_2)};$$  [004]

$$\beta = \operatorname{Arcsin} \frac{(d_1^2 + D^2 - D_1^2) d_2 \cos\gamma_2 - (d_2^2 + D^2 - D_2^2) d_1 \cos\gamma_1}{2 d_1 d_2 D \sin(\gamma_1 - \gamma_2)}$$  [005]

$$\alpha = \operatorname{Arccos} \frac{\frac{d_1^2 + D^2 - D_1^2}{2 d_1 D} - \sin\gamma_1 \sin\beta}{\cos\gamma_1 \cos\beta}$$  [006]

According to the invention, the distances $D_n$ can thus be measured by any appropriate measurement means known from the state of the art, such as, for example, laser rangefinding measurement means such as the laser distance meters sold on the market and having accuracies of the order of a millimeter.

However, in a preferred embodiment of the invention, the measurements are performed by means of the composite laser beam 43, which advantageously makes it possible not to have particular equipment to produce the measurement module 44.

From a hardware point of view, it should be noted that the points $C_n$ chosen to measure the distances $D_n$ can coincide with points $P_n$ on which photodiodes are positioned. Indeed, the matrix of photodiodes is provided at the points $P_n$ with filters each allowing one of the wavelengths $\lambda_n$ to pass.

Now, these filters can advantageously be catadioptric reflectors for wavelengths different from $\lambda_{n' \neq n}$ such that it is still possible to use the composite laser beam to perform the measurements of the $D_n$.

It should be noted that, because the device according to the invention comprises two completely separate subassemblies and the transmission of the phase law generated by the signal generator subassembly 41 is transmitted to the emission subassembly 42 by means of a composite laser beam aimed toward the latter using an aiming optic 417, the theoretical structure of the invention as illustrated by FIG. 4 can be extended to structures implementing two or more emission subassemblies arranged facing the signal generator subassembly 42.

Indeed, the aimed optic 417 of the signal generator 41 can be configured to direct a composite laser beam with an orientation from one panel to the other sequentially, the amplitude-phase law carried by the laser beam 43 being able to be different.

Thus, one and the same optical carrier amplitude-phase law signal generator 41 can control several emission subassemblies 42 to make them radiate different signals in different directions according to an appropriate sequencing, the phase laws associated with each of the emission subassemblies being the subject of a particular correction by the correction system of the device.

Figure 8:
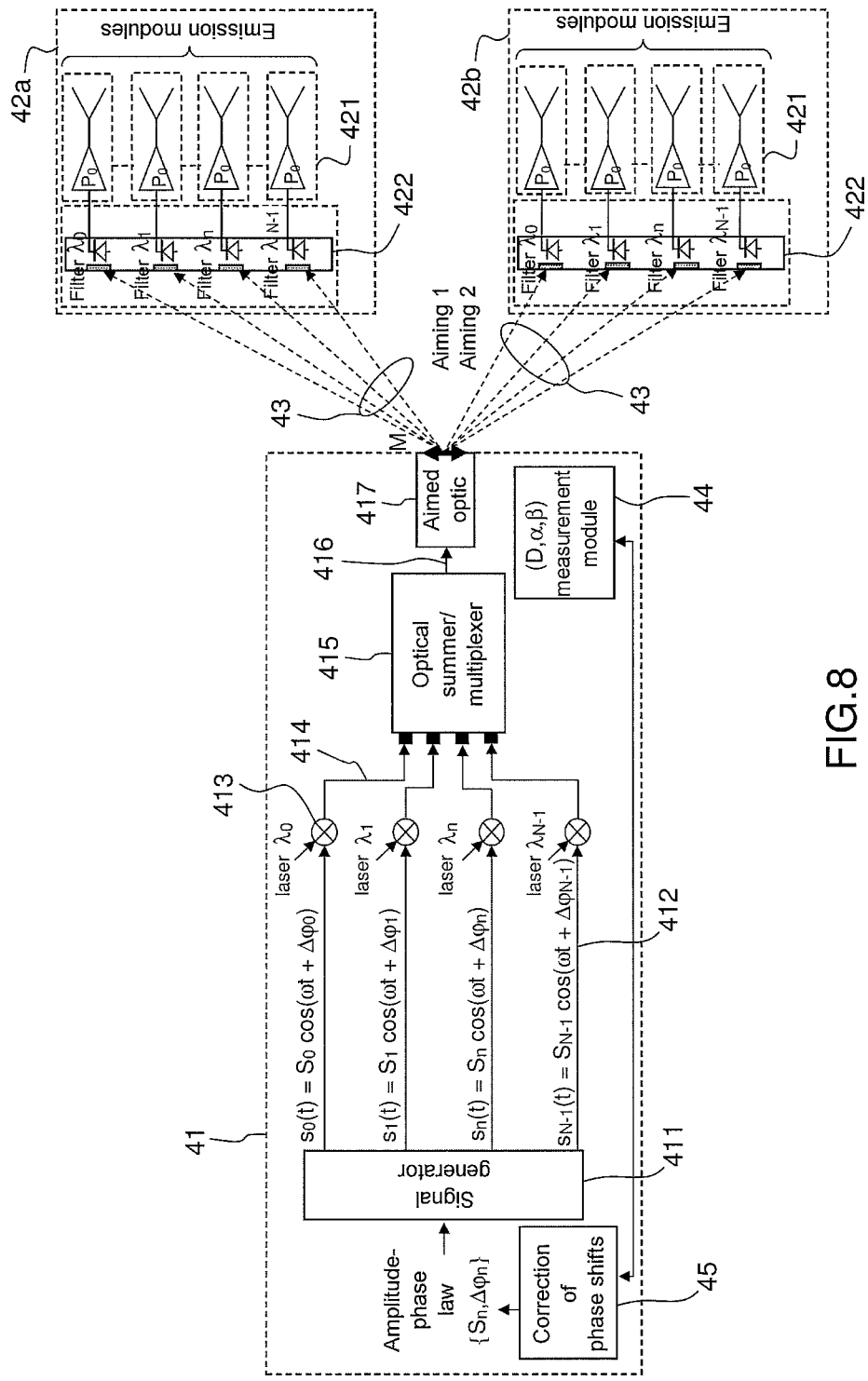
FIG. 8, a schematic illustration of the structure of a particular embodiment of the device according to the invention.

FIG. 8 offers a schematic representation of a radiant panel radio stimulation device according to the invention comprising two emission subassemblies 42a and 42b.

It should be noted that, contrary to what might be thought from the functional schematic representation of FIG. 4, the matrix of photodiodes with filters 422 does not, in the context of the present invention, occupy any particular position with respect to the emission modules 421. In particular, the matrix of photodiodes 422 is not necessarily placed on the face of the structure formed by the emission modules 421 opposite the radiating face thereof. The relative positioning of the matrix of photodiodes and of the emission modules is more generally linked to the constraints relating to the application considered.

The invention claimed is:

1. A radiant panel radio stimulation device, for emitting a test signal to a reception antenna, said radiant panel radio stimulation device comprising a subassembly generating excitation electrical signals each having a phase corresponding to a desired phase law $\{\Delta\varphi_n\}$ and at least one emission subassembly configured to amplify and radiate said excitation electrical signals so as to emit a radio beam in a direction determined by said desired phase law $\{\Delta\varphi_n\}$, the excitation electrical signals being transmitted by the subassembly generating excitation electrical signals to the at least one emission subassembly in the form of laser waves modulated by said excitation electrical signals and forming a composite laser beam directed toward a surface of a set of photodetectors incorporated in the at least one emission subassembly, wherein the subassembly generating excitation electrical signals and the at least one emission subassembly are arranged facing one another so that the composite laser beam is directed toward the surface of the set of photodetectors with an incidence ($\alpha$, $\beta$) relative to a reference axis and travels a distance D between its point of emission M and a reference point O situated on the reference axis at the surface of the set of photodetectors, and wherein the radiant panel radio stimulation device comprises a correction system configured to measure the values $\alpha$, $\beta$ and D and deliver a corrected phase law $\{\Delta\varphi_n'\}$ that is substituted for the desired phase law $\{\Delta\varphi_n\}$, the corrected phase law being defined in such a way that the radio beam produced from the excitation electrical signals generated by the subassembly generating excitation electrical signals is oriented in the direction determined by said desired phase law $\{\Delta\varphi_n\}$.

2. The radiant panel radio stimulation device as claimed in claim 1, wherein the corrected phase law $\{\Delta\varphi_n'\}$ is determined from a calculation of a path-length difference $\delta_n = D_n' - D$ generated, at each of the photodetectors of the set of photodetectors, by an angle of incidence of the composite laser beam on the surface of the set of photodetectors of the at least one emission subassembly (42), $\Delta\varphi_n'$ being defined by the relationship:

$$\Delta\varphi_n' = \Delta\varphi_n - 2\pi\frac{f_s}{c} \cdot \delta_n;$$

$D_n'$ representing the distance between the point of emission M of the composite laser beam and a position $P_n$ of the photodetector considered, and $f_s$ is the frequency of the radio beam.

3. The radiant panel radio stimulation device as claimed in claim 2, wherein the set of photodetectors is formed of photodetectors and the photodetectors which form the set of photodetectors of the at least one emission subassembly are arranged in a plane (xOz) on which their positions $P_n$ are registered, in terms of polar coordinates, by a distance $d_n'$ and an angle $\gamma_n'$, the path-length difference $\delta_n$ is defined, for each photodetector, by the following relationship:

$$\delta_n = D_n' - D$$
$$= D \cdot \left( \sqrt{1 - 2(\cos\gamma_n'\cos\beta\cos\alpha + \sin\gamma_n'\sin\beta)\left(\frac{d_n'}{D}\right) + \left(\frac{d_n'}{D}\right)^2} - 1 \right).$$

4. The radiant panel radio stimulation device as claimed in claim 3, wherein the values $\alpha$, $\beta$ and D are determined by considering a plurality of non-aligned points $C_n$, situated on the surface of the set of photodetectors, and by determining a distance $D_n$ separating the point emission M of the composite laser beam from each of the points $C_n$ considered.

5. The radiant panel radio stimulation device as claimed in claim 4, wherein at least three non-aligned points are considered.

6. The radiant panel radio stimulation device as claimed in claim 5, wherein the points $C_n$ are registered in the plane (xOz) by their distance $d_n$ to the reference point O and by an angle $\gamma_n$ between an axis linking the point $C_n$ considered to the point O and the reference axis, D, $\alpha$ and $\beta$ are given by the following relationships:

$$D = \sqrt{\frac{d_2 d_3 (D_1^2 - d_1^2)[\cos\gamma_2\sin(\gamma_1 - \gamma_3) - \cos\gamma_3\sin(\gamma_1 - \gamma_2)]}{d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)}} + \\ \frac{d_1\cos\gamma_1[d_2(D_3^2 - d_3^2)\sin(\gamma_1 - \gamma_2) - d_3(D_2^2 - d_2^2)\sin(\gamma_1 - \gamma_3)]}{d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)};$$

$$\beta = \text{Arcsin}\frac{d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)}{(d_1^2 + D^2 - D_1^2)d_2\cos\gamma_2 - (d_2^2 + D^2 - D_2^2)d_1\cos\gamma_1} \text{ and}$$

$$d^2 + D^2 - D^2$$

7. The radiant panel radio stimulation device as claimed in claim 4, wherein the distance $D_n$ is measured by laser rangefinding.

8. The radiant panel radio stimulation device as claimed in claim 4, wherein the distance $D_n$ is measured by using the composite laser beam produced by the subassembly generating excitation electrical signals.

9. The radiant panel radio stimulation device as claimed in claim 1, wherein the set of photodetectors consists of a matrix of photodiodes each associated with an optical filter configured to allow the exposure of a photodiode considered of the matrix of photodiodes only to one of the laser waves modulated by said excitation electrical signals and forming the composite laser beam.

10. The radiant panel radio stimulation device as claimed in claim 1, further comprising an electrical signal generator subassembly and at least two emission subassemblies, an aimed optic being configured to direct the composite laser beam alternately to one or more of the emission subassemblies, the correction system being configured to deliver, at each moment, the corrected phase law $\{\Delta\varphi_n'\}$ corresponding to the emission subassembly to which the composite laser beam is directed at the moment considered.

* * * * *

UNITED STATES PATENT AND TRADEMARK OFFICE
CERTIFICATE OF CORRECTION

PATENT NO. : 11,489,253 B2
APPLICATION NO. : 16/760651
DATED : November 1, 2022
INVENTOR(S) : Thierry Mazeau et al.

It is certified that error appears in the above-identified patent and that said Letters Patent is hereby corrected as shown below:

In the Claims

In Claim 4, Column 12, Line 11, "separating the point emission" should be -- separating the point of emission --.

In Claim 6, Column 12, Line 24,

"
$$D = \sqrt{\frac{d_2 d_3 (D_1^2 - d_1^2)[\cos\gamma_2 \sin(\gamma_1 - \gamma_3) - \cos\gamma_3 \sin(\gamma_1 - \gamma_2)]}{d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)}} +$$

$$\frac{d_1\cos\gamma_1[d_2(D_3^2 - d_3^2)\sin(\gamma_1 - \gamma_2) - d_3(D_2^2 - d_2^2)\sin(\gamma_1 - \gamma_3)]}{d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)};$$

$$d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)$$

$$\beta = \operatorname{Arcsin} \frac{(d_1^2 + D^2 - D_1^2)d_2\cos\gamma_2 - (d_2^2 + D^2 - D_2^2)d_1\cos\gamma_1}{2d_1 d_2 D \sin(\gamma_1 - \gamma_2)} \text{ and}$$

$$A^2 + D^2 - D^2$$
" should be

"
$$D = \sqrt{\frac{d_2 d_3 (D_1{}^2 - d_1{}^2)[\cos\gamma_2 \sin(\gamma_1 - \gamma_3) - \cos\gamma_3 \sin(\gamma_1 - \gamma_2)]}{d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)}} +$$

$$\frac{d_1\cos\gamma_1[d_2(D_3{}^2 - d_3{}^2)\sin(\gamma_1 - \gamma_2) - d_3(D_2{}^2 - d_2{}^2)\sin(\gamma_1 - \gamma_3)]}{d_3(d_2\cos\gamma_2 - d_1\cos\gamma_1)\sin(\gamma_1 - \gamma_3) - d_2(d_3\cos\gamma_3 - d_1\cos\gamma_1)\sin(\gamma_1 - \gamma_2)};$$

$$\beta = \operatorname{Arcsin} \frac{(d_1{}^2 + D^2 - D_1{}^2)d_2\cos\gamma_2 - (d_2{}^2 + D^2 - D_2{}^2)d_1\cos\gamma_1}{2d_1 d_2 D \sin(\gamma_1 - \gamma_2)} \text{ and}$$

$$\alpha = \operatorname{Arccos} \frac{\frac{d_1{}^2 + D^2 - D_1{}^2}{2d_1 D} - \sin\gamma_1 \sin\beta}{\cos\gamma_1 \cos\beta}.$$
--.

Signed and Sealed this
Seventeenth Day of January, 2023

*Katherine Kelly Vidal*

Katherine Kelly Vidal
*Director of the United States Patent and Trademark Office*